United States Patent
Yono et al.

(10) Patent No.: US 7,544,245 B2
(45) Date of Patent: Jun. 9, 2009

(54) METHOD FOR PRODUCING BARIUM TITANIUM OXIDE SINGLE-CRYSTAL PIECE USING CONTAINERLESS PROCESSING

(75) Inventors: Kentei Yono, Tsukuba (JP); Paul-Francois Paradis, Tsukuba (JP); Takehiko Ishikawa, Tsukuba (JP); Shinichi Yoda, Tsukuba (JP)

(73) Assignee: Japan Aerospace Exploration Agency, Tokyo (JP)

( * ) Notice: Subject to any disclaimer, the term of this patent is extended or adjusted under 35 U.S.C. 154(b) by 259 days.

(21) Appl. No.: 11/044,325

(22) Filed: Jan. 28, 2005

(65) Prior Publication Data
US 2005/0199180 A1    Sep. 15, 2005

(30) Foreign Application Priority Data
Jan. 29, 2004    (JP)    ............. 2004-020798

(51) Int. Cl.
*C30B 30/00*    (2006.01)
*C30B 13/00*    (2006.01)

(52) U.S. Cl. ............... 117/12; 117/11; 117/4; 117/901; 117/949

(58) Field of Classification Search ........... 117/11, 117/12, 4, 901, 949
See application file for complete search history.

(56) References Cited

U.S. PATENT DOCUMENTS

| | | | | |
|---|---|---|---|---|
| 6,153,007 A | * | 11/2000 | Nakata | 117/11 |
| 6,967,011 B1 | * | 11/2005 | Saboungi et al. | 423/249 |
| 2005/0024808 A1 | * | 2/2005 | Kawasaki et al. | 361/234 |

FOREIGN PATENT DOCUMENTS

| | | |
|---|---|---|
| JP | 08070100 A | 3/1996 |
| JP | 2001247362 A | 9/2001 |
| JP | 2003146697 A | 5/2003 |
| JP | 2005-53726 A | 3/2005 |

OTHER PUBLICATIONS

Paul-Francois Paradis et al., Non-Contact Density Measurements of Liquid and Undercooled Ceramics, The 24th Japan Symposium on Thermophysical Properties, 2003, p. 71-73.

* cited by examiner

*Primary Examiner*—Robert M Kunemund
*Assistant Examiner*—Matthew J Song

(57) ABSTRACT

Disclosed is a method for producing a barium titanium oxide single crystal piece with a given structure using a containerless solidification process, which comprises the steps of preparing a material made of a barium titanium oxide, controlling the material to be in a levitated state within a levitation furnace, melting the levitated material using a laser, and solidifying the molten material while maintaining the levitated state. In a specific embodiment, a spherical sample having a composition of $BaTiO_3$ and a weight of about 20 mg is subjected to a rapid solidification and melting process (temperature gradient: about 700 K/sec) 3 times while levitating the sample in 4.5 atm of air atmosphere using an electrostatic levitation furnace. Then, the re-molten sample is maintained at a temperature just below the melting point of the sample for a given time, and then rapidly cooled at a cooling rate of 300 K/sec to obtain a transparent blue barium titanium oxide single crystal. The single crystal exhibits innovative dielectric characteristics having a large relative permittivity (100,000 or more at room temperature) and a low dielectric loss. In addition, the single crystal has excellent temperature stability allowing the relative permittivity to be gently reduced in the range of room temperature to 70 K.

14 Claims, 9 Drawing Sheets

METHOD FOR PRODUCING BARIUM TITANIUM OXIDE SINGLE-CRYSTAL PIECE USING CONTAINERLESS PROCESSING

This application claims priority from Japanese Patent Application No. 2004-020798, filed Jan. 29, 2004, the entire disclosure of which is incorporated herein by reference.

BACKGROUND OF THE INVENTION

1. Field of the Invention

The present invention relates to a method for producing a high-purity $BaTiO_3$ single-crystal piece.

2. Description of the Background Art

Barium titanium oxides are classified into two types according to their crystal structures at room temperature. One type is a perovskite-structured barium titanium oxide (e.g. $BaTi_3$), and the other type is a hexagonal-structured barium titanium oxide. Typically, the hexagonal barium titanium oxide is prepared at a temperature higher than 1700 K by a crystal growth process from a melt or by a solid-phase sintering process. Whereas, the perovskite barium titanium oxide is prepared at a temperature lower than 1700 K by a crystal growth process from a melt or by a solid-phase sintering process. Single crystal growth form a melt usually needs to take more than ten hours and may be contaminated by impurities from container wall. The method of forming a crystalline material using the solid-phase sintering process is difficulty to synthesize a high density sample, and thereby involves a problem about deteriorated characteristic values of a product. For example, as to a maximum relative permittivity of a perovskite-structured barium titanium oxide around room temperature, while the value is about 6000 in the form of a single crystal, it is reduced up to 2000 in the form of a sintered body due to deterioration in density.

Although a perovskite-structured barium titanium oxide prepared by a conventional process has been used for electronic devices, it has a problem about instability in the temperature dependence of dielectric constant that is, a high permittivity at a phase transition temperature is sharply decrease when temperature deviates from the phase transition temperature.

A hexagonal-structured barium titanium oxide has a lower permittivity than that of a perovskite-structured barium titanium oxide. Specifically, a single crystal of the hexagonal-structured barium titanium oxide has a permittivity of 1000 or less at room temperature, and undergoes a phase transition at 74 K a maximum relative permittivity of about several thousand.

SUMMARY OF THE INVENTION

In view of the above circumstances, it is an object of the present invention to provide a method capable of melting a barium titanium oxide and solidifying the molten oxide at a given temperature by use of a containerless processing to produce a barium titanium oxide single-crystal with suitable properties for an intended use.

The present invention employs a containerless processing to solidify a molten material at a given temperature through a supercooled state (in which the material is in a liquid phase even at a temperature less than its melting point) while preventing the impurities from a container wall and the formation of crystal nuclei from the container wall, so as to obtain a barium titanium oxide single-crystal piece (1 mm cube or more) having desired physical properties through a carving or cutting process.

Specifically, in order to achieve the above object, the present invention provides a method for producing a barium titanium oxide single-crystal piece (1 mm cube or more) with a given structure using a containerless processing. The method comprises the steps of preparing a material made of a barium titanium oxide, controlling the material to be in a levitated state within a levitation furnace, melting the levitated material using a laser, solidifying the molten material while maintaining the levitated state, and cutting out a single crystal portion from an obtained product.

Preferably, in the step of controlling the material to be in a levitated state within a levitation furnace, the levitated state of the material is controlled by means of a Coulomb force.

Alternatively, the levitated state of the material may be controlled by means of a gas.

In the method of the present invention, the barium titanium oxide preferably has a composition represented by a general formula: $Ba_{(1-x)}M_xTiO_{3-y}$ (wherein M is either one selected from the group consisting of Sr, Ca and Pb, and each of x and y ranges from zero to 1), and may be typically $BaTiO_3$.

In one preferred embodiment of the present invention, the melting step includes heating the material up to its melting point or more to melt the material, and the solidifying step includes solidifying the molten material through its supercooled state. For example, the barium titanium oxide is heated up to its melting point (e.g. 1893 K) or more and molten. Then, the molten material is solidified from a supercooled state (e.g. from a temperature of 1673 K or less) to obtain $Ba_{(1-x)}M_xTiO_{3-y}$ with a desired structure.

Preferably, the melting step and the solidifying step are successively repeated plural times, for example about 3 to 5 times. In this case, the material repeatedly subjected to the melting and solidifying steps plural times may be re-heated and re-melted, and then maintained in a given supercooling temperature range which is less than its melting point and has a lower limit less than the melting point by about 200 K (preferably in a temperature range of 1723 K to less than 1893 K when the melting point is 1893 K). Then, the material in the supercooled state may be gradually cooled to obtain a solidified body allowing a barium titanium oxide single crystal piece with a hexagonal structure [e.g. $BaTiO_3$ (1 mm cube or more)] to be cut out therefrom.

In the above cooling step, the material is cooled at a cooling rate, preferably, of about 50 K/sec or less, more preferably of about 30 K/sec or less.

In another preferred embodiment, after the material repeatedly subjected to the melting and solidifying steps plural times is re-heated/re-melted and then maintained in a given supercooling temperature range less than its melting point, the material in the supercooled state may be rapidly cooled.

Thus, a desired barium titanium oxide (e.g. $BaTiO_{3-y}$) phase different in properties can be selectively solidified according to the aforementioned heat treatment conditions to obtain a solidified body allowing an intended barium titanium oxide single crystal piece (1 mm cube or more) to be cut out therefrom.

As mentioned above, according to the present invention, a liquid-phase material can be supercooled to a temperature less than its melting point using a containerless processing to adjust an initial solidification temperature so as to produce various barium titanium oxides different in structure. In addition, the present invention provides a novel method comprising the step of repeating the heating and cooling using the containerless solidification process to produce a solidified body allowing a single-crystal piece (1 mm cube or more) to be cut out therefrom. Furthermore, in the method of the present invention, a cooling rate can be adjusted to change the internal structure of a barium titanium oxide material so as to produce a barium titanium oxide single crystal having novel electrical characteristics. In particular, a hexagonal-structured barium titanium oxide single crystal obtained through the method of the present invention is expected to be usable as an optical element or an innovative material having a large relative permittivity.

Other features and advantages of the present invention will be apparent from the accompanying drawings and from the detailed description.

DESCRIPTION OF THE PREFERRED EMBODIMENTS

An embodiment of the present invention will now be described.

Firstly, an apparatus for use in implementing the present invention will be described below.

Figure 1:
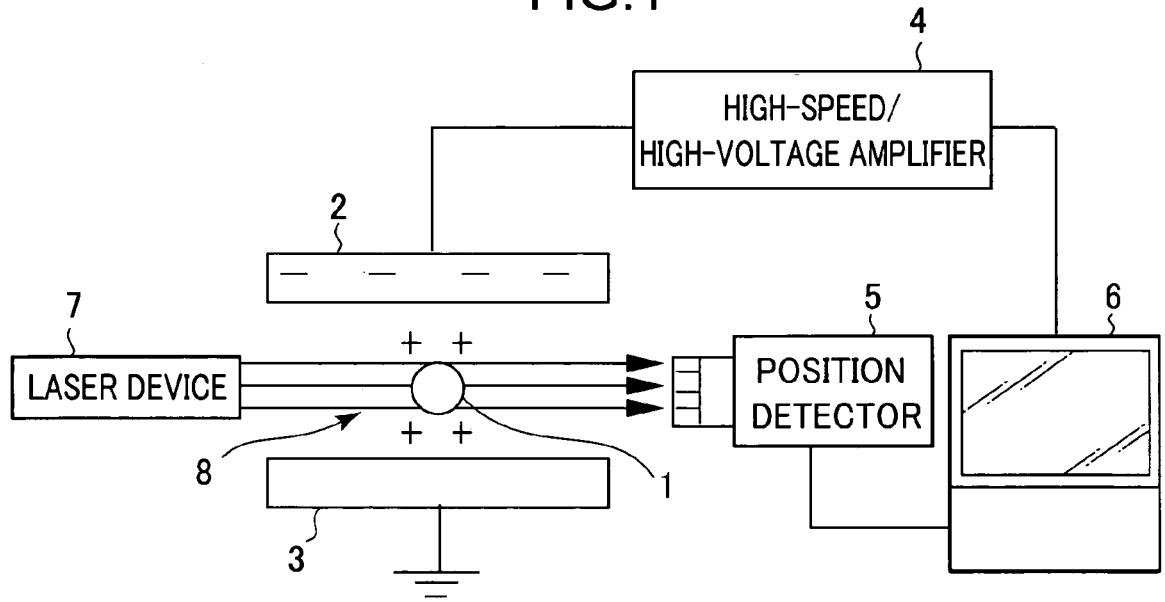
FIG. 1 is a schematic diagram showing the principle of performing the electrostatic levitation and position control of a sample.

The present invention is intended to solidify a sample in a containerless manner using a pressurized-type electrostatic levitation furnace. FIG. 1 shows the principle of the levitation and position control of a sample in an electrostatic levitation furnace used in one embodiment of the present invention. In FIG. 1, the electrostatic levitation furnace 10 in this embodiment comprises upper and lower electrodes 2, 3 adapted to generate a Coulomb force for levitating the sample 1. One of the electrodes (upper electrode 2 in this embodiment) is connected to a high-speed/high-voltage amplifier 4 for generating a high voltage at a high speed. The electrostatic levitation furnace 10 also includes a position detector 5 for detecting the levitated state or position of the sample. The position detector 5 is connected to a control computer 6 to input the detected position of the sample 1 into the computer 6. In response to the sample position information from the position detector 5, the computer 6 outputs to the amplifier 4 a signal for controlling a levitation force of the sample. The amplifier 4 changes the voltage according to the control signal from the computer 6, to change the levitation force or Coulomb force between the electrodes 2, 3. The furnace in this embodiment is designed to apply an electric field of about 10 kV/cm vertically to the electrostatically-charged sample 1. Specifically, a negative voltage is applied to the upper electrode 2 to generate an attractive force between the sample 1 and the electrodes 2, 3, so that the sample 1 is levitated when the attractive force is matched with the gravity (mg=QE; m: the mass of the sample, Q: the electrostatic charge of the sample, E: the electric field between the electrodes). Then, the position of the sample 1 is controlled using the position detector 4 and the computer 6, as described above. The electrostatic levitation furnace 10 further includes a laser device 7 for heating the sample 1. The laser device 7 is designed to emit a laser beam 8 to the levitated sample 1 so as to heat the sample up to a given temperature.

Figure 2:
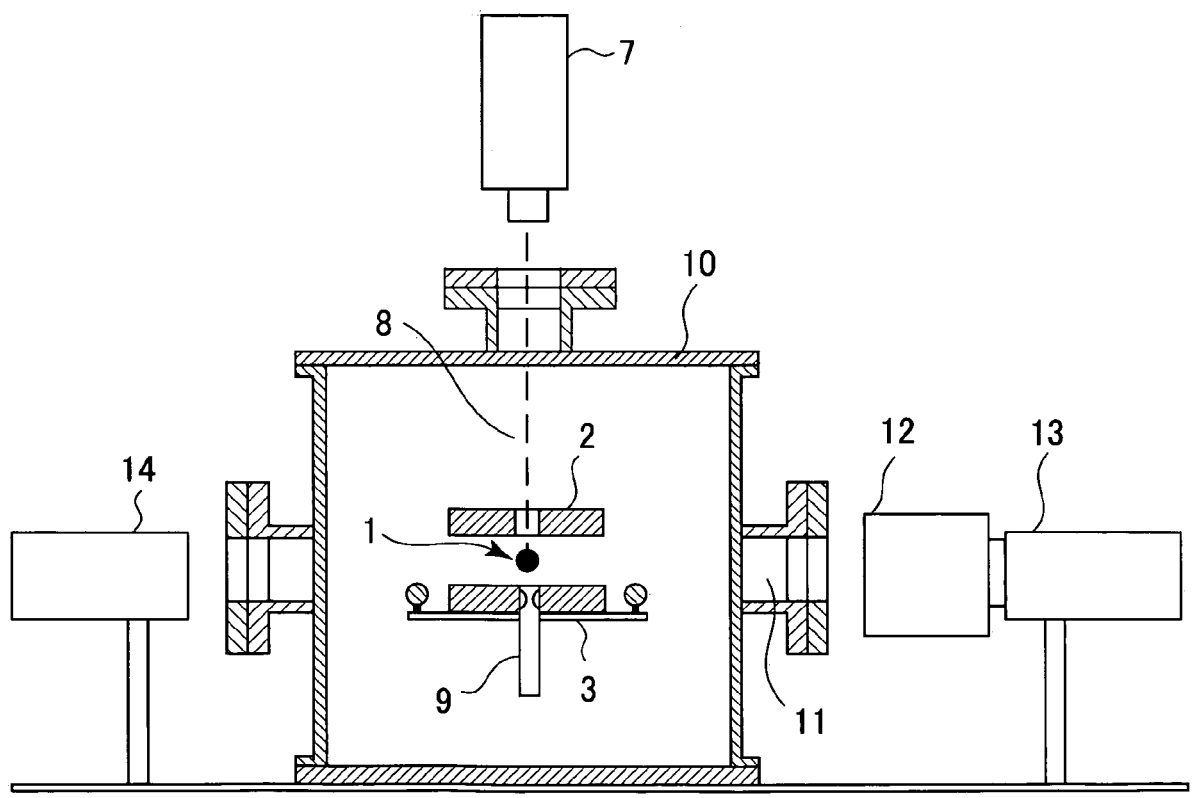
FIG. 2 is a schematic block diagram of an atmosphere-controlled/pressurized-type electrostatic levitation furnace.

FIG. 2 schematically shows the structure of a pressurized-type electrostatic levitation furnace 10 for use in implementing the present invention, wherein the same component as that in FIG. 1 is defined by the same reference numeral, and its detailed description will be omitted. This levitation furnace 10 comprises a gas nozzle 9 for introducing a gas (usable gas: air, Ar, O2, N2, etc.) at about 4.5 atm therein, a laser device 7 for emitting a laser beam from above upper and lower electrodes 2, 3 to heat a sample 1, and a radiation thermometer 14 for measuring the temperature of the sample 1 through an observation window attached to the sidewall of the furnace 10. In an operation for levitating the sample, the gas is firstly injected from the gas nozzle 9 having an opening at the center of the lower electrode 3 to levitate the sample 1. The laser beam is then emitted to the levitated sample 1 from above through an opening formed at the center of the upper electrode 2 to heat the sample 1 so as to allow the sample 1 to release thermoelectrons therefrom and become self-charged. Then, a certain voltage is applied from a high-speed/high-voltage amplifier 4 (see FIG. 1) between the upper and lower electrode 2, 3 to levitate the sample 1 by means of a Coulomb force. A CCD camera 13 is provided to observe the state or position of the sample 1 through an observation window 11 attached to the sidewall of the furnace 10 and a given filter 12, and pick up video images of the sample 1 as needed. The radiation thermometer 14 is disposed at approximately the same height as that of and a different angular position from that of the CCD camera 13 to measure the temperature of the sample 1 according to light emitted therefrom. An ultraviolet lamp is provided to finely pick up an image of the sample at a high temperature.

EXAMPLE 1

A commercially available $BaTiO_3$ power (99.9%; available from Rare Metallic Co.) was packed in a Penrose drain to form a rod-shaped sample having a diameter of about 3 mm and a length of about 100 mm using an isostatic pressing process, and the sample was sintered at 1573 K for 1 hour. The sintered sample was cut into a cubic-shaped sample having a weight of about 20 mg, and the cubic-shaped sample was formed into a spherical-shaped sample having a diameter of about 2 mm by use of a gas levitation furnace.

Figure 3:
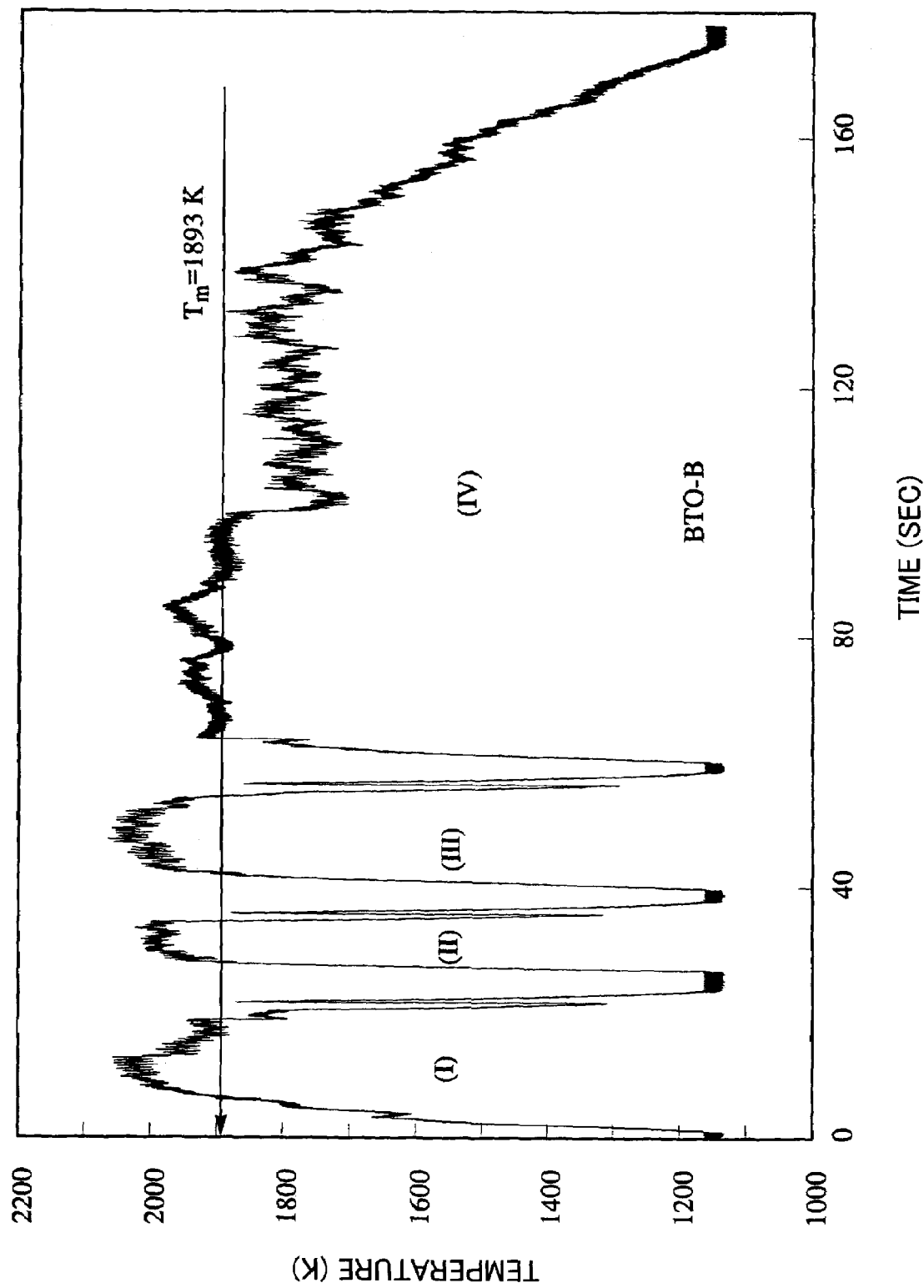
FIG. 3 is a graph showing a heating/cooling temperature curve of a sample BTO-B in Example 1.
Figure 4:
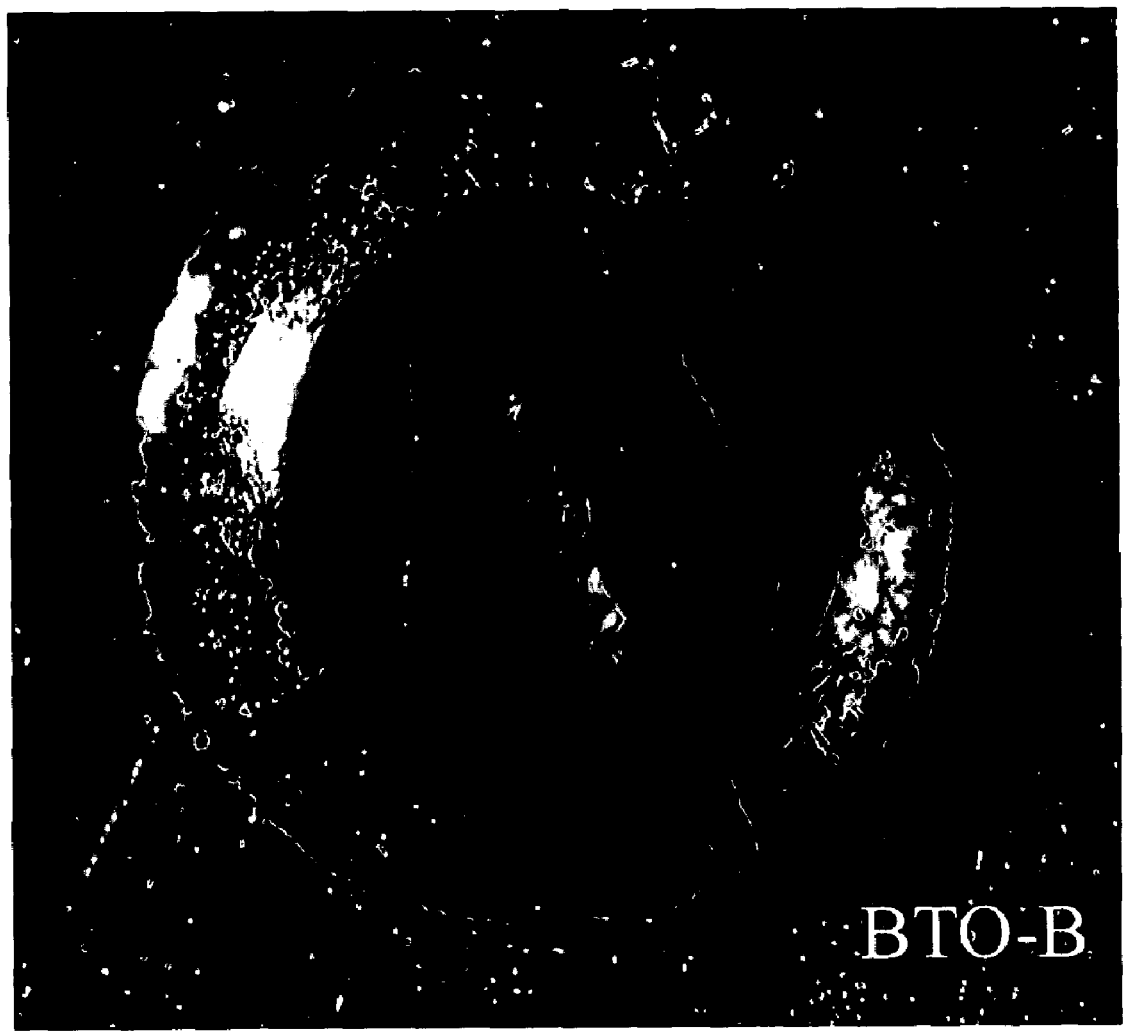
FIG. 4 is a microphotograph of the sample BTO-B in Example 1.
Figure 5:
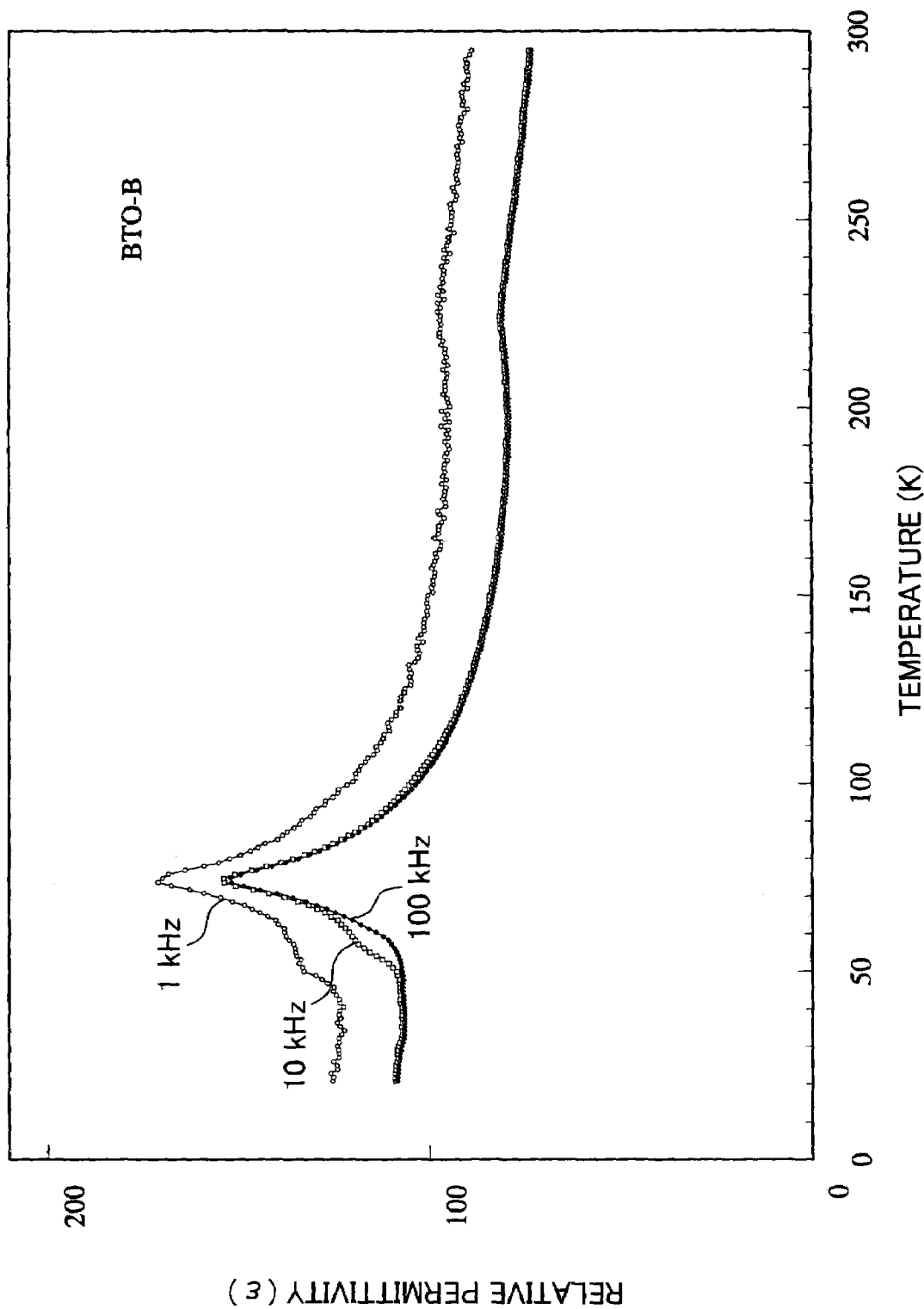
FIG. 5 is a graph showing the temperature dependence of permittivity of the sample BTO-B in Example 1.

In Example 1, the spherical-shaped sample having a composition of $BaTiO_3$ and a weight of about 20 mg (BTO-B) was subjected to the following melting and solidification process in the electrostatic levitation furnace. FIG. 3 shows the cooling curve of sample BTO-B. The sample was levitated in 4.5 atm of air atmosphere, and cooled rapidly from a temperature of about 2050 K greater than the melting point of the sample by about 150 K at a cooling rate of about 700 K/s it was repeatedly performed 3 times. Then, the re-molten sample was maintained at a temperature just below the melting point of the sample for a given time, and then gradually cooled at a cooling rate of about 30 K/sec. FIG. 4 shows an optical microscopic photograph of an obtained solidified body of the sample (BTO-B) in Example 1. As seen in the optical microscopic photograph, the solidified sample BTO-B is a transparent yellow barium titanium oxide. FIG. 5 shows the temperature dependence of permittivity of the solidified sample BTO-B. This temperature dependence of permittivity of the solidified sample is substantially identical to that of hexagonal $BaTiO_3$. A transparent single crystal to be cut out from this solidified sample has a high potential for use in an optical element capable of effectively generating second harmonics.

EXAMPLE 2

A spherical-shaped sample was prepared through the same process using the same apparatus as those in Example 1. In Example 2, the spherical-shaped sample having a composition of $BaTiO_3$ and a weight of about 20 mg (BTO-C) was subjected to the following melting and solidification process in the electrostatic levitation furnace.

Figure 6:
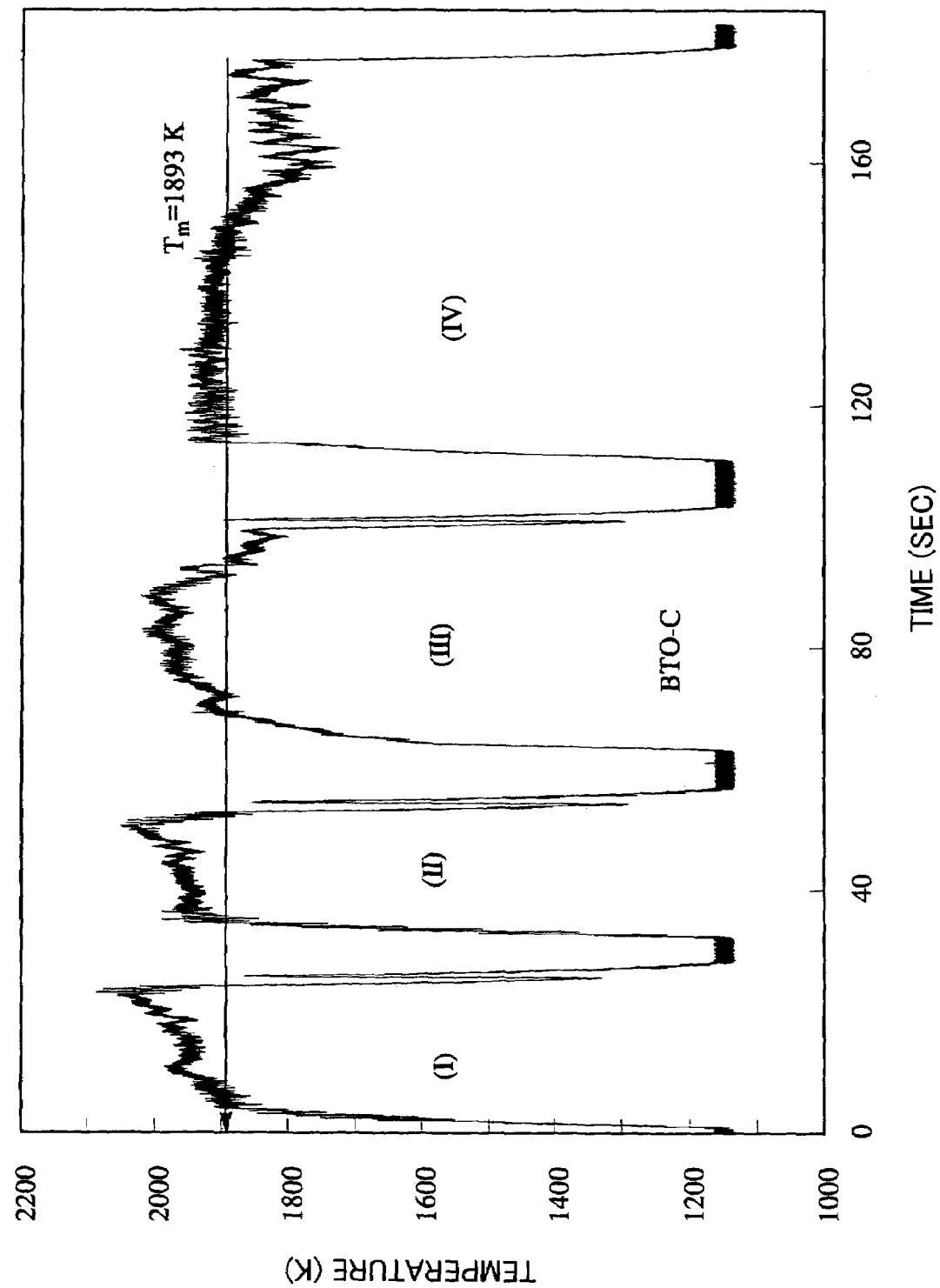
FIG. 6 is a graph showing a heating/cooling temperature curve of a sample BTO-C in Example 2.
Figure 7:
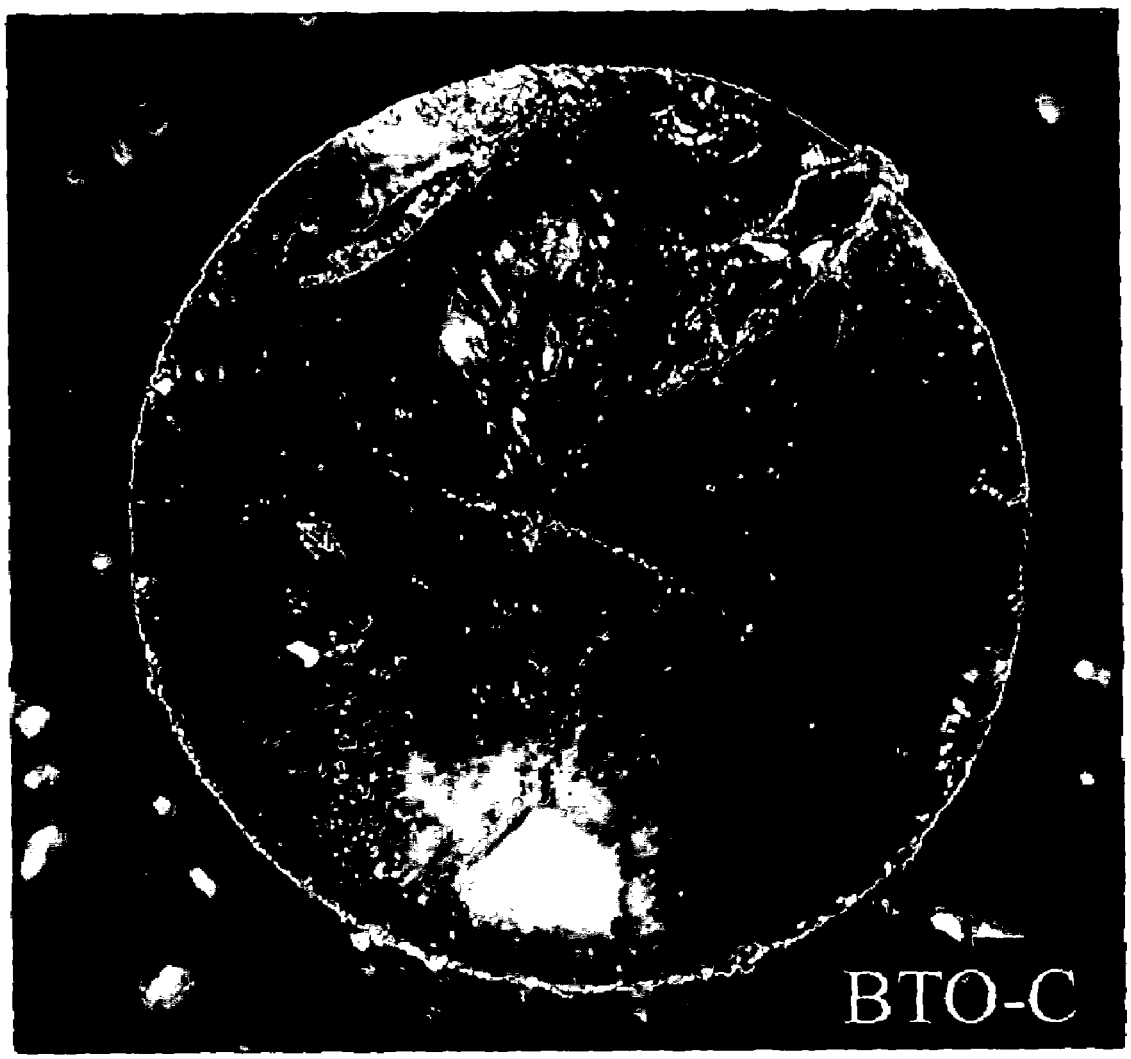
FIG. 7 is a microphotograph of the sample BTO-C in Example 2.
Figure 8:
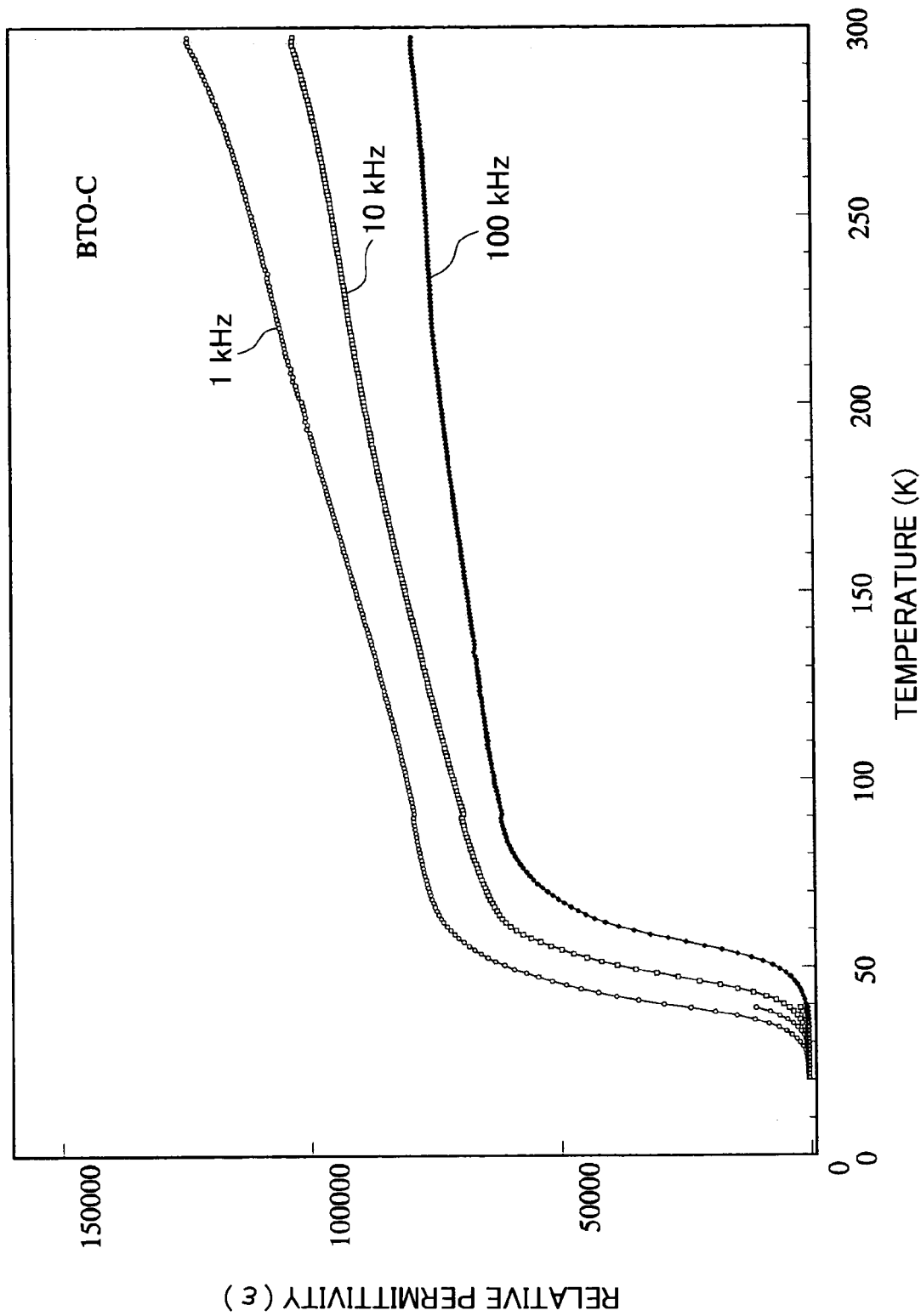
FIG. 8 is a graph showing the temperature dependence of permittivity of the sample BTO-C in Example 2.
Figure 9:
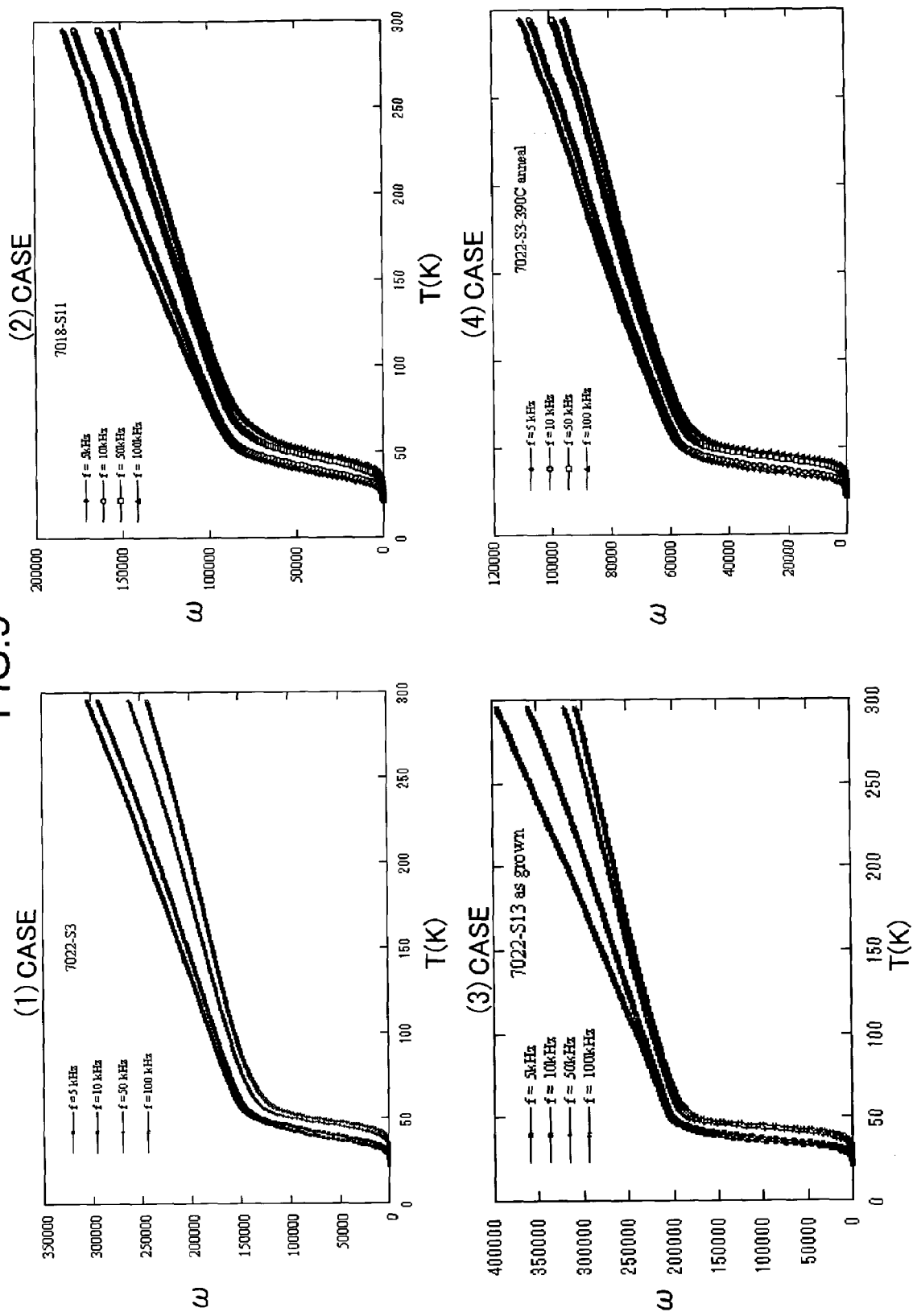
FIG. 9 is a graph showing the reproducibility of the temperature dependence of permittivity of the sample BTO-C in Example 2.

FIG. 6 shows the cooling curve of sample BTO-C. The sample was levitated in 4.5 atm of air atmosphere, and cooled rapidly from a temperature of about 2050 K greater than the melting point of the sample by about 150 K at a cooling rate of about 700 K/s it was repeatedly performed 3 times. Then, the re-molten sample was maintained at a temperature just below the melting point of the sample for a given time, and then rapidly cooled at a cooling rate of 300 K/sec. FIG. 7 shows an optical microscopic photograph of an obtained solidified body of the sample in Example 2. As seen in the optical microscopic photograph, the solidified sample is a transparent blue barium titanium oxide. FIG. 8 shows the temperature dependence of permittivity of the solidified body of the sample BTO-C in Example 2. As seen in FIG. 8, the solidified sample exhibits innovative dielectric characteristics having a large relative permittivity (100,000 or more at room temperature) and a low dielectric loss. In addition, the solidified sample has excellent temperature stability allowing the relative permittivity to be gently reduced in the range of room temperature to 70 K. The reproducibility of these characteristics has been verified as shown in FIG. 9.

Figure 10:
FIG. 10 is a transmission electron microphotograph of a single-crystal portion cut out from the sample BTO-C in Example 2.

The solidified sample was subjected to a four-axis X-ray diffraction analysis. As a result, it was proved that a single crystal portion having a significant size (1 mm cube or more) exists in the transparent $BaTiO_3$ sample prepared by the containerless solidification process (see FIG. 10). The excellent dielectric characteristics would be associated with oxygen defects and crystal defects residing in this internal crystal. Specifically, low-angle boundaries consisted of crystal defects can be observed within the single crystal portion. The crystals with a deficiency of oxygen have conductive properties, and the low-angle boundaries have insulative properties. These two phases different in electrical conduction property are combined together to form an infinite number of capacitors in the crystal, so that the crystal would exhibit the large relative permittivity. It is also proved that the crystal prepared by the process in this embodiment is an excellent product having a low temperature dependence of permittivity as described above. In FIGS. 5 and 8, each of 1, 10 and 100 kHz frequency of an AC field applied to the crystal during the measurement of permittivity thereof. That is, the permittivity of the crystal is varied depending on the frequency of the applied electric field. Generally, the permittivity is lowered as the frequency is increased.

Advantageous embodiments and examples of the present invention have been shown and described. It is obvious to those skilled in the art that various changes and modifications may be made without departing from the spirit and scope of the present invention as set forth in appended claims.

What is claimed is:

1. A method for producing a barium titanium oxide single crystal piece with a given structure using a containerless solidification process, comprising the steps of:
    (a) preparing a material made of a barium titanium oxide;
    (b) controlling said material to be in a levitated state within a levitation furnace by means of hybrid aerodynamic-electrostatic levitation;
    (c) melting said levitated material using a laser;
    (d) solidifying said molten material while maintaining the levitated state;
    (e) after repeating said melting step (c) and said solidifying step (d) plural times, re-heating and re-melting said solidified material;
    (f) then maintaining said re-molten material in a given supercooling temperature range less than a inciting point of said material;
    (g) then gradually cooling said material at a rate of about 50 K/sec or less from the supercooled state; and
    (h) producing the barium titanium oxide crystal piece using the containerless solidification process.

2. The method as defined in claim 1, wherein said barium titanium oxide has a composition represented by $Ba_{(1-x)}M_x TiO_{3-y}$, wherein M is selected from the group consisting of Sr, Ca and Pb, x ranges from zero to less than 1, and y ranges from zero to 1.

3. The method as defined in claim 1, wherein the lower limit of said given temperature range is a temperature less than said melting point by about 200 K.

4. The method as defined in claim 3, wherein said barium titanium oxide has a composition represented by $Ba_{(1-x)}M_x TiO_{3-y}$, wherein M is selected from the group consisting of Sr, Ca and Pb, x ranges from zero to less than 1, and y ranges from zero to 1.

5. The method as defined in claim 1, wherein the rate of gradual cooling is about 30 K/sec or less from the supercooled state.

6. The method as defined in claim 5, wherein the lower limit of said given temperature range is a temperature less than said melting point by about 200 K.

7. A method for producing a barium titanium oxide single crystal piece with a given structure using a containerless solidification process, comprising the steps of:
    (a) preparing a material made of a barium titanium oxide;
    (b) controlling said material to be in a levitated state within a levitation furnace using control means selected from the group consisting of a Coulomb force and a gas;
    (c) melting said levitated material using a laser;
    (d) solidifying said molten material while maintaining the levitated state;
    (e) after repeating said melting step (c) and said solidifying step (d) plural times, re-heating and re-melting said solidified material;
    (f) then maintaining said re-molten material in a given supercooling temperature range less than a melting point of said material;
    (g) then gradually cooling said material at a rate of about 50 K/sec or less from the supercooled state; and
    (h) producing the barium titanium oxide crystal piece using the containerless solidification process.

8. The method as defined in claim 7, wherein the barium oxide single crystal produced by the method is produced without impurities from a surface of any container.

9. The method as defined in claim 8, further comprising the step of:

cutting a cube of 1 mm or more from the barium oxide single crystal piece.

10. The method as defined in claim 7, further comprising the step of:
cutting a cube of 1 mm or more from the barium oxide single crystal piece.

11. A method for producing a barium titanium oxide single crystal piece with a given structure using a containerless solidification process, comprising the steps of:
(a) preparing a material made of a barium titanium oxide;
(b) controlling said material to be in a levitated state within a levitation furnace;
(c) melting said levitated material using a laser;
(d) solidifying said molten material while maintaining the levitated state;
(e) producing the barium titanium oxide crystal piece using the containerless solidification process;
(f) after repeating said melting step and said solidifying step plural times, re-heating and re-melting said solidified material;
(g) then maintaining said re-molten material in a given supercooling temperature range less than a melting point of said material; and
(h) then gradually cooling said material at a rate of about 50 K/sec or less from the supercooled state, wherein the lower limit of said given temperature range is a temperature less than said melting point by about 200 K and wherein said barium titanium oxide has a composition represented by $Ba_{(1-x)}M_xTiO_{3-y}$, wherein M is selected from the group consisting of Sr, Ca and Pb, x ranges from zero to less than 1, and y ranges from zero to 1.

12. The method as defined in claim 11, wherein the barium oxide single crystal produced by the method is produced without impurities from a surface of any container.

13. The method as defined in claim 12, further comprising the step of:
cutting a cube of 1 mm or more from the barium oxide single crystal piece.

14. The method as defined in claim 11, further comprising the step of:
cutting a cube of 1 mm or more from the barium oxide single crystal piece.

* * * * *